United States Patent [19]

Brown

[11] Patent Number: 4,527,127
[45] Date of Patent: Jul. 2, 1985

[54] FREQUENCY ACQUISITION CIRCUIT FOR PHASE LOCKED LOOP

[75] Inventor: Kenneth H. Brown, Clarkdale, Ariz.
[73] Assignee: Motorola Inc., Schaunburg, Ill.
[21] Appl. No.: 394,022
[22] Filed: Jun. 30, 1982
[51] Int. Cl.³ .............................................. H03D 3/00
[52] U.S. Cl. ................... 329/122; 331/1 A; 331/DIG. 2
[58] Field of Search ................. 329/50, 122, 123, 124, 329/139; 331/1 A, 2, 4, 11, 17, 18, 23, 25, DIG. 2; 375/52, 54, 55, 81, 86, 87, 120; 455/260, 262, 266

[56] References Cited

U.S. PATENT DOCUMENTS

| | | | |
|---|---|---|---|
| 3,882,412 | 5/1975 | Apple, Jr. | 331/25 X |
| 4,072,905 | 2/1978 | Keelty | 375/81 X |
| 4,087,628 | 5/1978 | Sanders et al. | 329/122 X |
| 4,100,503 | 7/1978 | Lindsey et al. | 331/DIG. 2 X |
| 4,107,623 | 8/1978 | Graf et al. | 331/1 A |
| 4,131,862 | 12/1978 | Black et al. | 331/25 X |
| 4,313,219 | 1/1982 | Gabler et al. | 329/122 X |
| 4,423,390 | 12/1983 | Waters | 331/DIG. 2 X |

FOREIGN PATENT DOCUMENTS 130862  10/1979  Japan ........................... 331/DIG. 2

OTHER PUBLICATIONS

Blanchard, A. "Phase-Locked Loops Application to Coherent Receiver Design" Wiley & Sons, 1976 pp. 280-289.
Watkinson, S. W. "A Dual Phase Lock Loop Receiver", Philips Telecommunication Review, vol. 36, No. 1, pp. 5-12, (Apr. 1978).

Primary Examiner—Eugene R. LaRoche
Assistant Examiner—Robert J. Pascal
Attorney, Agent, or Firm—Eugene A. Parsons

[57] ABSTRACT

A phase locked loop having a second controllable oscillator connected to mix with the input signal to alter the frequency thereof toward phase lock and a pair of comparators with predetermined upper and lower limits therein connected to the control signal of the phase locked loop and controlling the controllable oscillator whenever the control signal is outside of the predetermined limits.

7 Claims, 2 Drawing Figures

FREQUENCY ACQUISITION CIRCUIT FOR PHASE LOCKED LOOP

BACKGROUND OF THE INVENTION

The present invention pertains to phase locked loops and especially to phase locked loops utilized in phase shift keyed demodulators and the like. Typical examples of phase locked loops utilized in various types of phase shift keyed demodulators are illustrated in U.S. Pat. No. 4,188,589, entitled "Automatic Signal Acquisition Means for a Phase Locked Loop With Anti-Sideband Lock Protection" and in U.S. Pat. No. 3,768,030, entitled "Automatic Signal Acquisition Means for Phase Locked Loop with Anti-Sideband Lock Protection". In phase locked loops and especially these types of applications, it is extremely difficult to provide the proper frequency acquisition sensitivity and still maintain the desired phase locked loop characteristics. It is especially difficult to provide the proper bandwidth and acquisition speed when the incoming signal has large frequency excursions.

SUMMARY OF THE INVENTION

The present invention pertains to a method of improving frequency acquisition of a phase locked loop and apparatus including a controllable oscillator coupled to the input of the phase locked loop for altering the frequency of input signals to the phase locked loop and means coupled to the loop control circuitry and to said controllable oscillator for controlling the controllable oscillator to reduce the frequency difference between the input signal to the phase locked loop and the frequency of the controllable oscillator in the phase locked loop when the frequency difference exceeds a predetermined amount. The second controllable oscillator and control circuitry forms a second loop which operates only when the error in the phase locked loop exceeds predetermined limits.

It is an object of the present invention to provide a new and improved phase locked loop with increased frequency acquisition sensitivity.

It is a further object of the present invention to provide a new and improved phase locked loop wherein acquisition can be obtained even under large frequency excursions with relatively low loop gain in the phase locked loop, thereby reducing loop stress.

These and other objects of this invention will become apparent to those skilled in the art upon consideration of the accompanying specification, claims and drawings.

BRIEF DESCRIPTION OF THE DRAWINGS

Referring to the drawings, wherein like characters indicate like parts throughout the figures.

DESCRIPTION OF THE PREFERRED EMBODIMENTS

Figure 1:
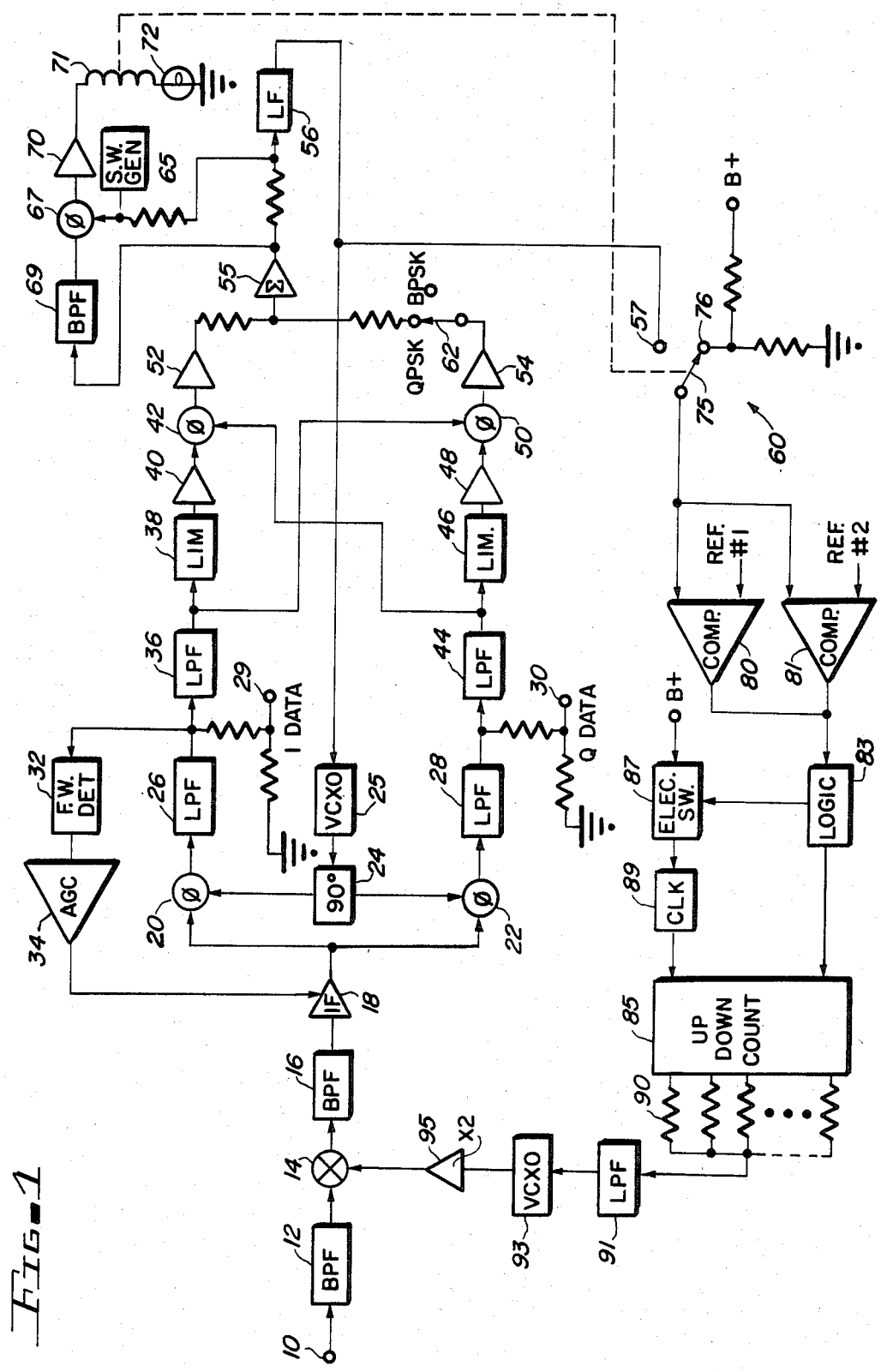
FIG. 1 is a block diagram of a PSK demodulator embodying the present invention.

Referring specifically to FIG. 1, the numeral 10 designates an input terminal adapted to receive, in this specific embodiment, a phase shift keyed (PSK) modulated signal. The signal supplied to the terminal 10 may be transmitted directly or may have previous operations performed thereon, such as reductions in frequency, filtering, etc. The signal at the terminal 10 is supplied through a bandpass filter 12 to one input of a mixing circuit 14. The signal is mixed with a signal supplied to a second input of the mixing circuit 14 and a predetermined combination is selected by means of a band pass filter 16. The selected signal is supplied to an IF amplifier 18 having a controllable gain. The output of the amplifier 18 is the input to a phase locked loop forming the PSK demodulator of the present system. It should be understood that the present invention pertains to a phase locked loop and apparatus and methods for improving the frequency acquisition sensitivity. While a specific embodiment and application of a phase locked loop is illustrated herein and specific circuitry supplying signals to the phase locked loop is disclosed, this specific use and circuitry is illustrated simply as an example and should not limit the invention in any way.

The input to the phase locked loop from the IF amplifier 18 is supplied to first and second phase detectors 20 and 22, respectively. Second inputs are supplied to each of the phase detectors 20 and 22 from a 90° phase shifting circuit 24, which supplies signals to the phase detector circuits 20 and 22 that are 90° out of phase with respect to each other. The phase shifting circuit 24 receives signals from a voltage control oscillator 25. Output signals from the phase detectors 20 and 22 are supplied to low pass filters 26 and 28, respectively, the outputs of which are supplied to output terminals 29 and 30, respectively, by way of resistive networks to ground. Output terminal 29 supplies in-phase data while output terminal 30 supplies quadrature data, as is normal in this type demodulator.

The output signals from the low pass filter 26 are also supplied through a full wave detector 32 and AGC amplifier 34 to a control terminal of the IF amplifier 18 to control the gain thereof in accordance with normal AGC operation. It will of course be understood that the described AGC circuit is not essential to the operation of the phase locked loop or the improvement thereon to be described.

To provide the error signals which control the oscillator 25 and, hence, the phase locked loop, the output signal from the low pass filter 26 is supplied through a low pass filter 36, a limiter 38, and an amplifier 40 to one input of a phase detector 42 and the output of the low pass filter 28 is supplied through a low pass filter 44, a limiter 46, and an amplifier 48, to one input of a phase detector 50. A second input of the phase detector 42 is supplied from the output of the low pass filter 44 and a second input of the phase detector 50 is supplied from the output of the low pass filter 36. The outputs of the phase detectors 42 and 50 are each amplified in amplifiers 52 and 54, respectively, and the amplified outputs thereof are summed in a summation circuit 55. The output from the summation circuit 55 is supplied through a loop filter 56, the output of which is the error signal that controls the phase locked loop, to the control input of the oscillator 25. It is also supplied to one fixed terminal 57 of a lock/unlock relay contact, generally designated 60. It should be noted that the double phase locked loop illustrated is utilized as a QPSK demodulator. A single pole double throw switch 62 is connected between the output of amplifier 54 and the input of summation circuit 55 and when the switch is in the position illustrated (QPSK) the circuit is connected as described. When the switch 62 is moved to the other position (BPSK) the lower portion of the loop, representing the quadrature data portion, is removed from the circuit so that the phase locked loop operates as a BPSK demodulator.

A lock detecting circuit is connected to the phase locked loop as follows. A square wave generator 65 supplies a square wave output signal to the input of the loop filter 56 and to one input of a phase detector 67. The output of the summation circuit 55 is connected through a bandpass filter 69 to a second input of the phase detector 67. The output of the phase detector 67 is connected through an amplifier 70, a relay coil 71 of the relay contact 60 and an indicator lamp 72 to ground. The square wave signal from the generator 65 provides a dithering, or perterbation, in the phase locked loop which appears at the output of the summation circuit 55 and is compared to the original square wave signal from the generator 65 in the phase detector 67. If the phase locked loop is operating in the locked condition the two signals in the detector 67 will correspond in phase and an output signal from the detector 67 will energize the relay contact 60 by way of the coil 71. It will of course be understood by those skilled in the art that other types of lock indicating circuits might be utilized and the present one is illustrated because of its simplicity of construction and operation.

The fixed terminal 57 of the lock/unlock relay 60 has associated therewith a moveable arm 75 and a second fixed terminal 76. The terminal 76 has a positive voltage supplied thereto by way of a resistive divider network connected between B+ and ground. The moveable arm 75 is connected to an input of each of a pair of comparators 80 and 81. Second inputs of each of the comparators are connected to upper and lower predetermined signals, which in this embodiment are first and second reference voltages, respectively, to provide predetermined limits between which the comparators 80 and 81 do not respond. The outputs of the comparators 80 and 81 are supplied to a logic circuit 83, the output of which is connected to an up/down counter 85 and to an electric switch 87 which controls a clock 89 that supplies clock pulses to the counter 85. The outputs of the counter 85 control a voltage divider ladder network 90 which is in turn connected through a low pass filter 91 to the control input of a voltage controlled crystal oscillator 93. The network 90 supplies step changes of voltage to the oscillator 93 for controlling the output frequency thereof. The frequency of the output of the oscillator 93 is doubled in a doubling circuit 95 and supplied to the second input of the multiplier 14.

In the operation of the circuit illustrated in FIG. 1, the moveable arm 75 is illustrated in the de-energized position of relay 60, which occurs when the phase locked loop is in the unlocked condition. In this position a positive voltage is applied to the input of each of the comparators 80 and 81 which overrides the reference voltages and causes the logic circuit 83 to energize the counter 85 and start the clock 89. The up/down counter supplies step voltages to the oscillator 93 in a generally saw-tooth, or sweeping, operation. Since the counter 85 causes the oscillator 93 to sweep through its range, the initial direction in which the counter 85 begins is not crucial. Thus, the logic circuit 83 simply starts the counter 85 and the clock 89 causes it to progress from step to step through its entire range, if necessary. As the oscillator 93 moves from step to step the phase locked loop will continuously attempt to lock onto the input frequency. Generally, each step of the oscillator 93 should be sufficiently broad to allow the oscillator 25 and the phase locked loop time to lock onto the input signal if the input signal lies within range of the step. When the phase locked loop locks onto the input signal the locked condition is sensed by the lock detecting circuit and the coil 71 of relay 60 is energized causing the moveable arm 75 to move into engagement with the stationery contact 57. In this mode of operation the error signal from the loop filter 56 is supplied to the inputs of the comparators 80 and 81. If the error signal from the loop filter 56 is sufficiently large to overcome either one of the references 1 or 2 a signal will be supplied from that comparator 80 or 81 to the logic circuit 83 to energize the counter 85 and clock 89 and cause the oscillator 93 to move closer to the operating frequency of the phase locked loop. If the error signal from the loop filter 56 is not sufficiently large to overcome either of the references 1 or 2 the comparators 80 and 81 will remain inoperative and the oscillator 93 will be maintained at its present operating frequency.

Thus, the frequency acquisition sensitive circuit including the comparators 80 and 81, the counter 85 and the oscillator 93 operates in a rough or coarse fashion to bring the phase locked loop within an acquisition range. Further, because of the frequency acquisition sensitive circuit the phase locked loop can be operated with a much smaller pull-in or locking range and with much less gain. This greatly reduces the stress of the phase locked loop and allows much better operating characteristics.

Figure 2:
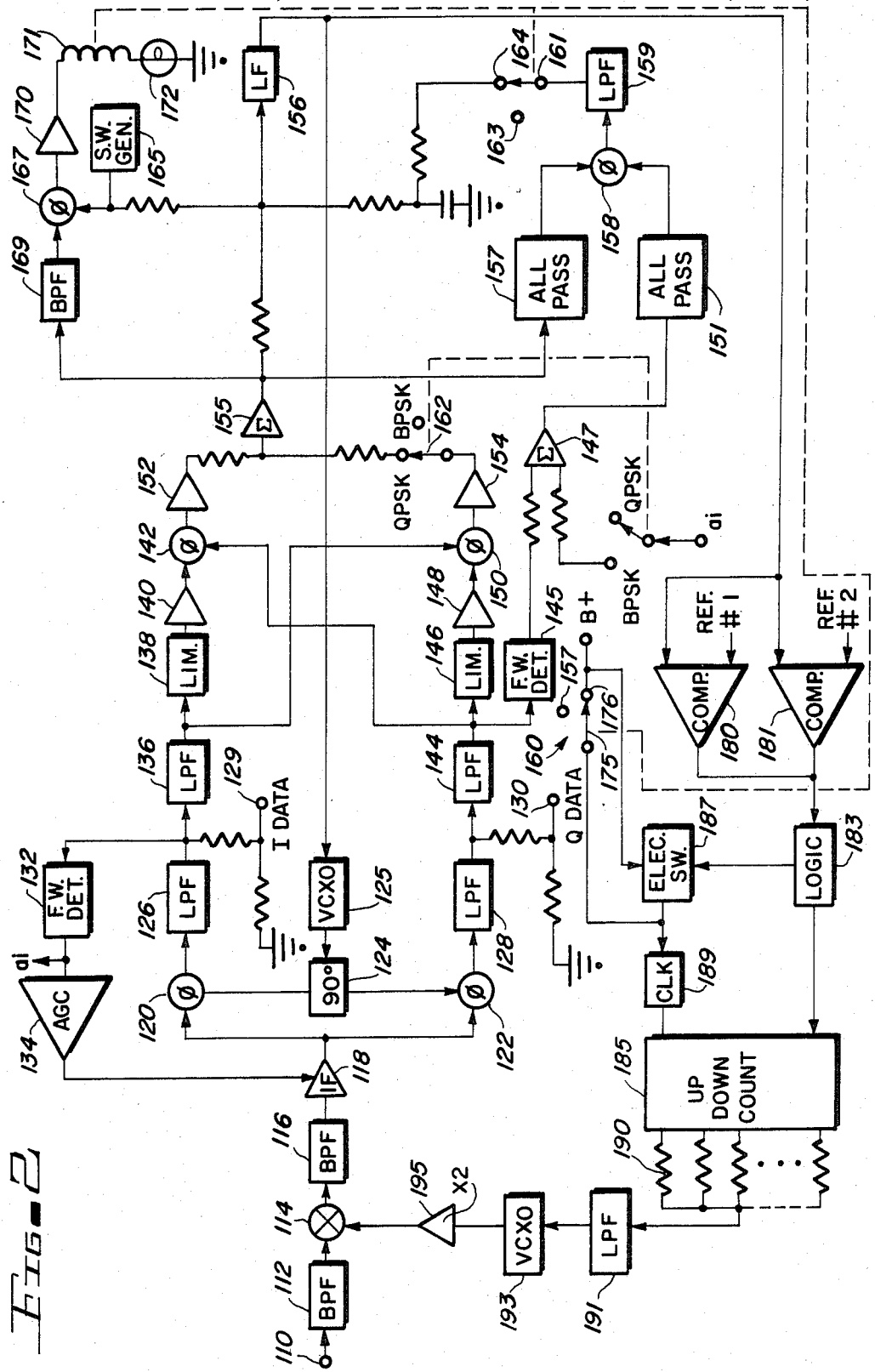
FIG. 2 is a block diagram similar to FIG. 1 with an automatic frequency control circuit added.

Referring to FIG. 2, the circuit illustrated is generally similar to the circuit of FIG. 1 except that the PSK demodulator has an automatic frequency control (AFC) circuit associated therewith. Components of the circuit illustrated in FIG. 2 which are similar to components of FIG. 1 are designated with a similar number and all of the numbers of the circuit of FIG. 2 are preceeded by a 1 to indicate a different embodiment. Generally, the phase locked loop, the AGC circuit and the lock detecting circuit are similar to that described in conjunction with FIG. 1 and will not be described in detail. The frequency acquisition sensitive circuit is substantially similar to the circuit described in FIG. 1, except that the error signal from the loop filter 156 is supplied directly to the inputs of the comparators 180 and 181 and the relay contacts are situated between the clock 189 and a B+ supply. The moveable arm 175 is normally engaged with the fixed contact 176, when the phase locked loop is in the unlocked condition, so that B+ is supplied directly to the clock 189 to cause it to operate continuously. The fixed contact 157 has no connections thereto so that the clock 189 must receive an activation voltage from the electric switch 187 in the locked condition of the phase locked loop. Since the comparators 180 and 181 are connected to the loop filter 156 continuously, whenever the error voltage from the loop filter 156 is sufficiently high to overcome either of the references 1 or 2 the logic circuit 183 will activate the electric switch 187 which will start the clock 189 and cause the counter 185 to bump the oscillator 193 in a direction to reduce the error voltage from the loop filter 156.

A full wave detector 145 is connected to receive output signals from the low pass filter 144 and supply output signals to one input of a summation circuit 147. The full wave detector 132 in the AGC circuit also supplies signals to the summation circuit 147 in the QPSK mode of operation. The output of the summation circuit 147 is supplied through an all pass network 151 to one input of a phase detector 158. A second input of the phase detector 158 is received from the output of the summation circuit 155 by way of a second all pass network 157. The output of the phase detector 158 is supplied through a low pass filter 159 to a second moveable arm 161 of the relay 160. The moveable arm 161 is normally engaged with a fixed contact 164 (position illustrated) which is in turn connected to the input of the loop filter 156. When the phase locked loop is in the locked condition and the coil 171 of the relay 160 is energized the moveable arm 161 moves into engagement with a second fixed contact 163 which disconnects the AFC circuit from the loop filter.

The AFC circuit is a slight modification over the circuit illustrated and described in U.S. Pat. No. 4,188,589 (described above). The AFC circuit is connected to the phase locked loop only during its unlocked condition and generally provides the error voltage with a polarity so that the frequency acquisition sensitive circuit will move in the correct direction to reduce the error voltage (by way of the connection of the logic circuit 183 to the counter 185). Thus, with the AFC circuit in the phase locked loop, acquisition will be somewhat quicker than the circuit illustrated in FIG. 1 wherein the positive voltage supplied to the comparators 80 and 81 in the unlocked condition simply cause the counter 85 to sweep the oscillator 93 through its range.

Thus, a phase locked loop and frequency acquisition circuit are disclosed which improve the frequency acquisition capabilities of the phase locked loop and reduce the loop stress. With very little additional circuitry the phase locked loop operation can be greatly enhanced. In addition to improving the acquisition sensitivity, the loop gain of the phase locked loop can be reduced and the circuit will automatically correct for system frequency errors under temperature variations. While I have shown and described specific embodiments of this invention, further modifications and improvements will occur to those skilled in the art. I desire it to be understood, therefore, that this invention is not limited to the particular forms shown and I intend in the appended claims to cover all modifications which do not depart from the spirit and scope of this invention.

I claim:

1. In conjunction with a phase locked loop including an input, a controllable oscillator, and loop control circuitry, a frequency acquisition sensitive circuit comprising:
   a second controllable oscillator coupled to the input of the phase locked loop for altering the frequency of input signals to the phase locked loop; and
   means coupled to the loop control circuitry and to said second controllable oscillator for controlling said second controllable oscillator to reduce the frequency difference between the input signals to the phase locked loop and the frequency of the controllable oscillator in the phase locked loop when the frequency difference exceeds a predetermined amount and for maintaining said second controllable oscillator at a constant frequency when the frequency difference is below the predetermined value.

2. The frequency acquisition circuit of claim 1 wherein the coupled means includes a pair of comparators each having a different one of an upper and a lower predetermined amplitude signal supplied to an input thereof with a second input of each of said comparators being coupled to the loop control circuitry.

3. The frequency acquisition circuit of claim 2 wherein the coupled means further includes oscillator control circuitry coupled to supply control signals to the second controllable oscillator in response to a signal from either of the pair of comparators.

4. The frequency acquisition circuit of claim 3 wherein the oscillator control circuitry includes an up-down counter connected to activate a voltage divider network which is in turn connected to supply step function control signals to the second controllable oscillator.

5. Phase locked loop circuitry with improved acquisition sensitivity comprising:
   a phase locked loop including an input, a controllable oscillator, and loop control circuitry coupled to supply a control signal to the controllable oscillator;
   a second controllable oscillator coupled to the input of said phase locked loop for altering the frequency of input signals supplied to said phase locked loop; and
   means coupled to the loop control circuitry and to said second controllable oscillator for controlling said second controllable oscillator to reduce the frequency difference between the input signals to said phase locked loop and the frequency of the controllable oscillator in said phase locked loop when the frequency difference exceeds a predetermined amount and for maintaining said second controllable oscillator at a constant frequency when the frequency difference is below the predetermined amount.

6. Phase locked loop circuitry as claimed in claim 5 wherein the input signal is a PSK signal and the phase locked loop serves to demodulate the signal.

7. Phase locked loop circuitry as claimed in claim 6 wherein the input includes a mixing circuit having a first input connected to receive a phase shift keyed signal and a second input coupled to the second controllable oscillator and the coupled means is coupled to receive the control signal supplied to the controllable oscillator of the phase locked loop.

* * * * *